United States Patent
Okamoto et al.

(10) Patent No.: US 7,746,132 B2
(45) Date of Patent: Jun. 29, 2010

(54) PLL CIRCUIT

(75) Inventors: Tatsuo Okamoto, Kyoto (JP); Yukio Arima, Osaka (JP); Tsuyoshi Ebuchi, Osaka (JP); Kyoko Hirata, Osaka (JP)

(73) Assignee: Panasonic Corporation, Osaka (JP)

( * ) Notice: Subject to any disclaimer, the term of this patent is extended or adjusted under 35 U.S.C. 154(b) by 114 days.

(21) Appl. No.: 12/066,000

(22) PCT Filed: Jul. 27, 2006

(86) PCT No.: PCT/JP2006/314916

§ 371 (c)(1),
(2), (4) Date: Mar. 6, 2008

(87) PCT Pub. No.: WO2007/029428

PCT Pub. Date: Mar. 15, 2007

(65) Prior Publication Data

US 2009/0153203 A1    Jun. 18, 2009

(30) Foreign Application Priority Data

Sep. 8, 2005   (JP)  .............................. 2005-260831

(51) Int. Cl.
*H03L 7/06* (2006.01)
(52) U.S. Cl. ........................ 327/156; 327/147
(58) Field of Classification Search ............... 327/141, 327/142, 147, 156, 148, 150, 157, 159; 375/376
See application file for complete search history.

(56) References Cited

U.S. PATENT DOCUMENTS

| | | | |
|---|---|---|---|
| 6,407,600 B1 | 6/2002 | Lu et al. | |
| 6,792,064 B2 * | 9/2004 | Nakamura | 375/376 |
| 6,853,254 B2 * | 2/2005 | Li | 331/16 |
| 7,310,009 B2 * | 12/2007 | Oh | 327/156 |
| 7,323,943 B2 * | 1/2008 | Kaneko et al. | 331/12 |
| 2005/0012528 A1 | 1/2005 | Kodama | |

FOREIGN PATENT DOCUMENTS

| | | |
|---|---|---|
| JP | 60-132419 | 7/1985 |
| JP | 4-266221 | 9/1992 |
| JP | 10-290161 | 10/1998 |
| JP | 11-103249 | 4/1999 |
| JP | 2000-22529 | 1/2000 |
| JP | 2001-016100 | 1/2001 |
| JP | 2001-177403 | 6/2001 |
| JP | 2004-96436 | 3/2004 |

* cited by examiner

*Primary Examiner*—Hai L Nguyen
(74) *Attorney, Agent, or Firm*—McDermott Will & Emery LLP (57) ABSTRACT

A PLL comprises a current-controlled oscillator (18) for generating an output clock signal based on a current signal generated based on a phase difference between a reference clock signal and a feedback clock signal, a current source (28), and an initialization switch (26) for performing an open/close operation based on the initialization signal, the initialization switch being inserted in series to an input terminal of the current-controlled oscillator (18) and the current source (28).

3 Claims, 9 Drawing Sheets

PLL CIRCUIT

RELATED APPLICATIONS

This application is the U.S. National Phase under 35 U.S.C. §371 of International Application No. PCT/JP2006/314916, filed on Jul. 27, 2006, which in turn claims the benefit of Japanese Application No. 2005-260831, filed on Sep. 8, 2005, the disclosures of which Applications are incorporated by reference herein.

TECHNICAL FIELD

The present invention relates to a PLL (Phase-Locked-Loop) and, more particularly, to a PLL capable of being started up and restarted up in a stable manner with a reduced level of jitter and a technique for its sequence.

BACKGROUND ART

In interface standards, such as representatively Serial ATA, a clock signal having a high frequency of 1.5 GHz is required, which is typically generated from a reference clock signal having a low frequency of about 25 MHz by means of the multiplication function of a PLL. For example, by using a PLL capable of 60-fold multiplication, a reference clock signal of 25 MHz can be used to generate a clock signal of 1.5 GHz (=25 MHz*60). Further, if a fractional-N frequency division circuit technique using $\Delta\Sigma$ modulation is employed, the 1.5-GHz clock signal can be generated from an output frequency of 16.934 MHz or 27 MHz of a quartz oscillator.

In conventional typical PLLs, the output voltage of a loop filter is in the vicinity of zero during its start-up, and therefore, the gate-source voltage of an NMOS transistor included in a voltage-current converting circuit does not exceed the threshold, so that the output current of the voltage-current converting circuit becomes substantially zero. As a result, the frequency of an output clock signal becomes 0 Hz, and the output of the PLL has a high impedance. If no disturbance or the like occurs, the PLL is normally started up by a feedback action. However, if incoming high-frequency noise is frequency-divided by a divider, then when the resultant frequency is higher than a reference clock signal, the PLL performs an operation so as to lower the frequency of the output clock signal. As a result, the output voltage of the loop filter remains zero, so that the PLL fails to be started up.

To solve the problem above, a conventional technique has been proposed in which two PLLs having different capture ranges and jitters are provided and switched between during start-up and during a normal operation (see, for example, Patent Document 1). Another technique has been proposed in which a PLL is more quickly returned to a normal operation mode from a standby mode, and a start-up circuit is provided in the PLL (see, for example, Patent Document 2).

Patent Document 1: Japanese Unexamined Patent Application Publication No. H10-290161
Patent Document 2: U.S. Pat. No. 6,407,600

DISCLOSURE OF THE INVENTION

Problems to be Solved by the Invention

However, it is clear that the circuit scale increases when two PLLs are provided. Therefore, in view of the problem above, an object of the present invention is to provide a PLL capable of being started up and restarted up in a sable manner without particularly increasing the circuit scale.

Solution to the Problems

To achieve the object, a means provided by the present invention is a PLL circuit comprising a loop filter for smoothing a current which is pushed and pulled in accordance with a phase difference between a reference clock signal and a feedback clock signal, a voltage-current converting circuit for converting an output voltage of the loop filter into a current, and a current-controlled oscillator for generating an output clock signal based on a current signal output from the voltage-current converting circuit, characterized by comprising a current source, an initialization switch which, when receiving an initialization signal, goes to a conductive state, and otherwise, goes to a non-conductive state, the initialization switch being inserted in series to an input terminal of the current-controlled oscillator and the current source, a reset switch which, when receiving a reset signal, goes to a conductive state, and otherwise, goes to a non-conductive state, the reset switch being provided between an input terminal of the voltage-current converting circuit and a ground node, a deadlock detecting circuit for detecting that the PLL circuit is in a deadlock state, and a control section for outputting the reset signal when the deadlock state detected by the deadlock detecting circuit continues for a predetermined time or more, and outputting the initialization signal during start-up of the PLL circuit and following the outputting of the reset signal.

Also, a PLL circuit is provided which comprises a loop filter for smoothing a current which is pushed and pulled in accordance with a phase difference between a reference clock signal and a feedback clock signal, and a voltage-current converting circuit for converting an output voltage of the loop filter into a current, characterized by comprising a current source, an initialization switch which, when receiving an initialization signal, goes to a conductive state, and otherwise, goes to a non-conductive state, the initialization switch being inserted in series to an input terminal of the loop filter and the current source, and a reset switch which, when receiving a reset signal, goes to a conductive state, and otherwise, goes to a non-conductive state, the reset switch being provided between an input terminal of the voltage-current converting circuit and a ground node, a deadlock detecting circuit for detecting that the PLL circuit is in a deadlock state, and a control section for outputting the reset signal when the deadlock state detected by the deadlock detecting circuit continues for a predetermined time or more, and outputting the initialization signal during start-up of the PLL circuit and following the outputting of the reset signal.

Also, a PLL circuit is provided which comprises a phase detector for comparing a phase difference between a reference clock signal and a feedback clock signal, a loop filter for smoothing a current which is pushed and pulled in accordance with a result of phase comparison by the phase detector, and a voltage-current converting circuit for converting an output voltage of the loop filter into a current, characterized by comprising a clock generating circuit for generating a dummy clock signal having a phase difference with reference to the reference clock signal, and a selector for inputting the dummy clock signal to the phase detector when an initialization signal is at a predetermined logic level, and the feedback clock signal to the phase detector when the initialization signal is at a logic level other than the predetermined logic level, a reset switch which, when receiving a reset signal, goes to a conductive state, and otherwise, goes to a non-conductive state, the reset switch being provided between an input terminal of the voltage-current converting circuit and a ground node, a deadlock detecting circuit for detecting that the PLL circuit is in a deadlock state, and a control section for outputting the reset signal when the deadlock state detected by the deadlock detecting circuit continues for a predetermined time or more, and outputting the initialization signal having the predetermined logic level during start-up of the PLL circuit and following the outputting of the reset signal.

EFFECT OF THE INVENTION

According to the present invention, a start-up current is supplied from a current source or a start-up voltage is supplied from a voltage source, during start-up and restart-up of a PLL, so that the output of the PLL does not have a high impedance. Thereby, a PLL is achieved which is operated in a stable manner even if disturbance noise is input during start-up and restart-up. Also, it is not necessary to provide two PLLs, so that the circuit scale does not significantly increase.

DESCRIPTION OF THE REFERENCE CHARACTERS 10 phase detector
14 loop filter
16 voltage-current converting circuit
18 current-controlled oscillator
20 divider (fractional-N frequency divider)
22 deadlock detecting circuit
24 control section
26 switch (initialization switch)
28 current source
30 switch (reset switch)
32 voltage source
34 clock generating circuit
36 selector
38 ΔΣ controller
40 clamp circuit
341 inverter
342 divider
CK1 reference clock signal
CK2 feedback clock signal
CK3 output clock signal STUP initialization signal
RST reset signal

BEST MODE FOR CARRYING OUT THE INVENTION

Hereinafter, a best mode for carrying out the present invention will be described with reference to the accompanying drawings.

First Embodiment

Figure 1:
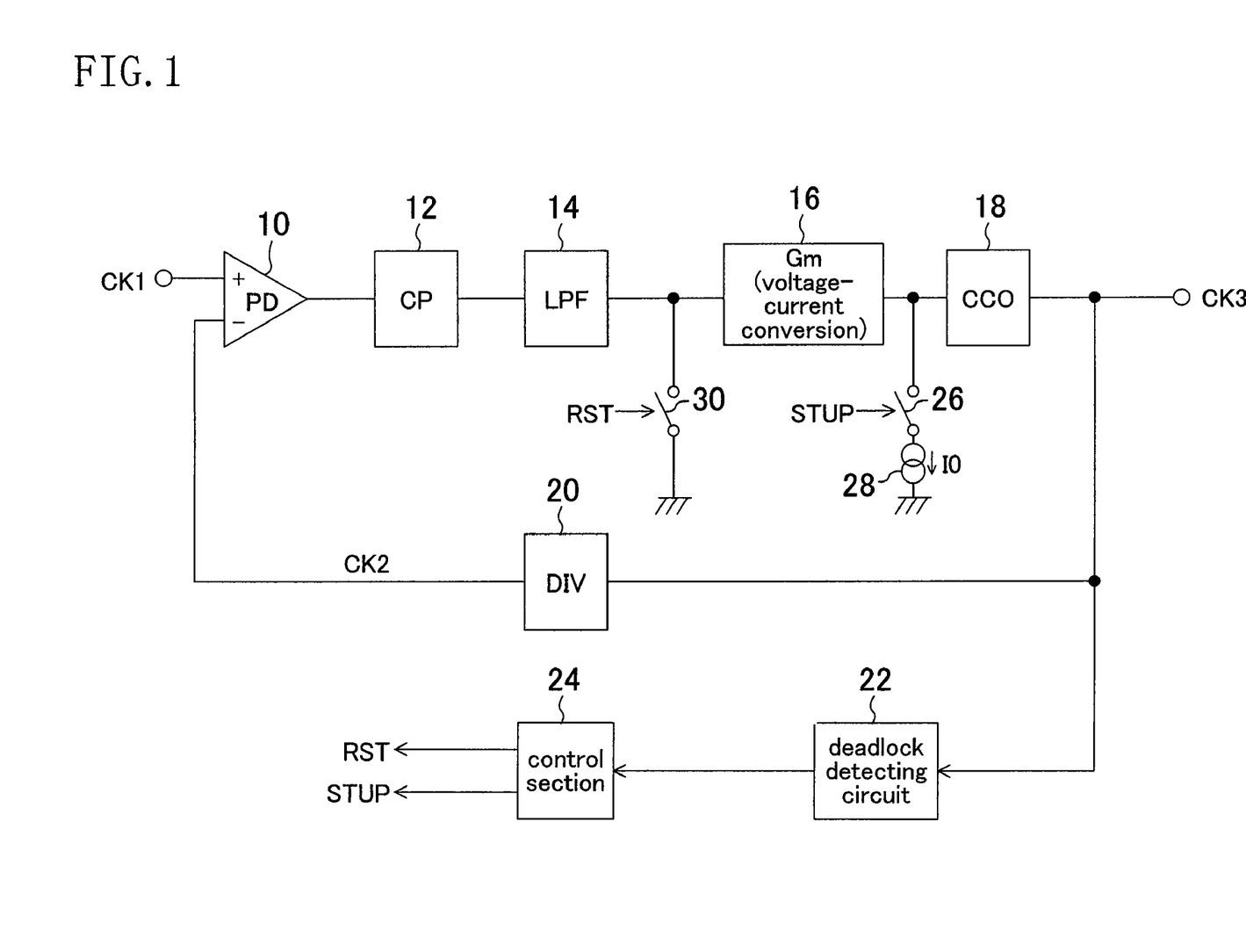
FIG. 1 is a diagram showing a configuration of a PLL according to a first embodiment.

FIG. 1 shows a configuration of a PLL according to a first embodiment. The PLL of this embodiment comprises typical PLL components, such as a phase detector 10, a charge pump 12, a loop filter or a low-pass filter 14, a voltage-current converting circuit 16, a current-controlled oscillator 18, and a divider 20, and in addition, a deadlock detecting circuit 22, a control section 24, a switch 26 (initialization switch), a current source 28, and a switch 30 (reset switch).

The phase detector 10 detects a phase difference between a reference clock signal CK1 and a feedback clock signal CK2. The phase detector 10 can be comprised of a flip-flop and a logic element, or the like.

The charge pump 12 performs push-pull with respect to a current, depending on the output phase difference of the phase detector 10.

The loop filter 14 charges and discharges a current output from the charge pump 12. The loop filter 14 can be comprised of a resistor and a capacitor, or the like, and its filter order can be arbitrarily set as second-order, third-order, or the like.

The voltage-current converting circuit 16 converts a voltage signal output from the loop filter 14 into a current signal. The voltage-current converting circuit 16 can be comprised of a MOS transistor, a bipolar transistor, or the like. For example, if the voltage-current converting circuit 16 is comprised of an NMOS transistor or an NPN transistor, then when the output voltage of the loop filter 14 is smaller than or equal to the threshold value of the transistor, a so-called dead-zone region occurs in which a current is not output.

The current-controlled oscillator 18 generates an output clock signal CK3 based on a current signal output from the voltage-current converting circuit 16. The current-controlled oscillator 18 can be comprised of an inverter ring or the like. Note that, in the dead-zone region described above, a current signal is not input, so that the output of the inverter ring has a high impedance.

The divider 20 frequency-divides the output clock signal CK3 to generate the feedback clock signal CK2, and feeds the feedback clock signal CK2 back to the phase detector 10. Due to this feedback action, the frequency of the output clock signal CK3 becomes a frequency which is obtained by multiplying the reference clock signal CK1 by the multiplication number of the divider 20, and the frequency is locked.

The deadlock detecting circuit 22 measures the frequency of the output clock signal CK3 so as to detect that the PLL is in the deadlock state.

The control section 24 outputs an initialization signal STUP during start-up and restart-up of the PLL. The control section 24 also outputs a reset signal RST when the deadlock state detected by the deadlock detecting circuit 22 continues for a predetermined time or more.

The switch 26, which is connected in series to the input terminal of the current-controlled oscillator 18 and the current source 28, performs an open/close operation based on the initialization signal STUP. Specifically, the switch 26, which receiving the initialization signal STUP, is switched ON, so that a current I0 of the current source 28 is supplied to the current-controlled oscillator 18.

The switch 30, which is provided between the loop filter 14 and a ground node, performs an open/close operation based on the reset signal RST. Specifically, the switch 30, when receiving the reset signal RST, is switched ON, so that the output voltage of the loop filter 14 is set to be at a ground level.

Next, an operation of the PLL of this embodiment will be described with reference to a timing chart of FIG. 2.

When the PLL is powered ON, the initialization signal STUP is output from the control section 24 ("A" in FIG. 2), so that the switch 26 is switched ON and the current I0 is then supplied to the current-controlled oscillator 18. The current-controlled oscillator 18 generates the output clock signal CK3 based on the supplied current I0, and the output clock signal CK3 is provisionally locked at a desired frequency due to the feedback action of the PLL. Thereafter, when the output of the initialization signal STUP is stopped, the switch 26 is switched OFF, so that the PLL normally receives a signal. Thereby, the output voltage of loop filter 14 is corrected (an increase in the output voltage in the example of FIG. 2), so that the PLL goes to a truly locked state.

Here, the current source 28 typically contains a noise component generated from a band gap. Therefore, if the current I0 is supplied to the current-controlled oscillator 18, the jitter characteristics of the output clock signal CK3 are deteriorated. Therefore, as described above, the current I0 is supplied to the current-controlled oscillator 18 only during start-up of the PLL (and during restart-up) so as to prevent the output of the PLL from having a high impedance, and the current I0 is interrupted after the PLL goes to the provisionally locked state. In the truly locked state, since the current I0 is not input to the PLL, an increase in output jitter due to the current I0 does not occur.

If the PLL is in the truly locked state, then when the voltage of the loop filter 14 largely increases due to disturbance noise, the frequency of the output clock signal CK3 excessively increases, so that the current-controlled oscillator 18 and the divider 20 no longer operate normally. Also, when the frequency of the output clock signal CK3 falls below the locked frequency while the output voltage of the loop filter 14 well exceeds the locked voltage, the PLL performs an operation so as to cause the loop filter 14 to be further charged due to the feedback action, so that the PLL goes to a so-called deadlock state in which the output voltage of the loop filter 14 is fixed to a power supply voltage. Once the PLL falls into the deadlock state, the PLL cannot be returned from the deadlock state.

Therefore, when the deadlock state detected by the deadlock detecting circuit 22 continues for a predetermined time or more, the reset signal RST is output from the control section 24 ("B" in FIG. 2), so that the switch 30 is switched ON and the output voltage of the loop filter 14 is then set as the ground level (the loop filter is reset). Thereby, the deadlock state can be avoided.

Figure 2:
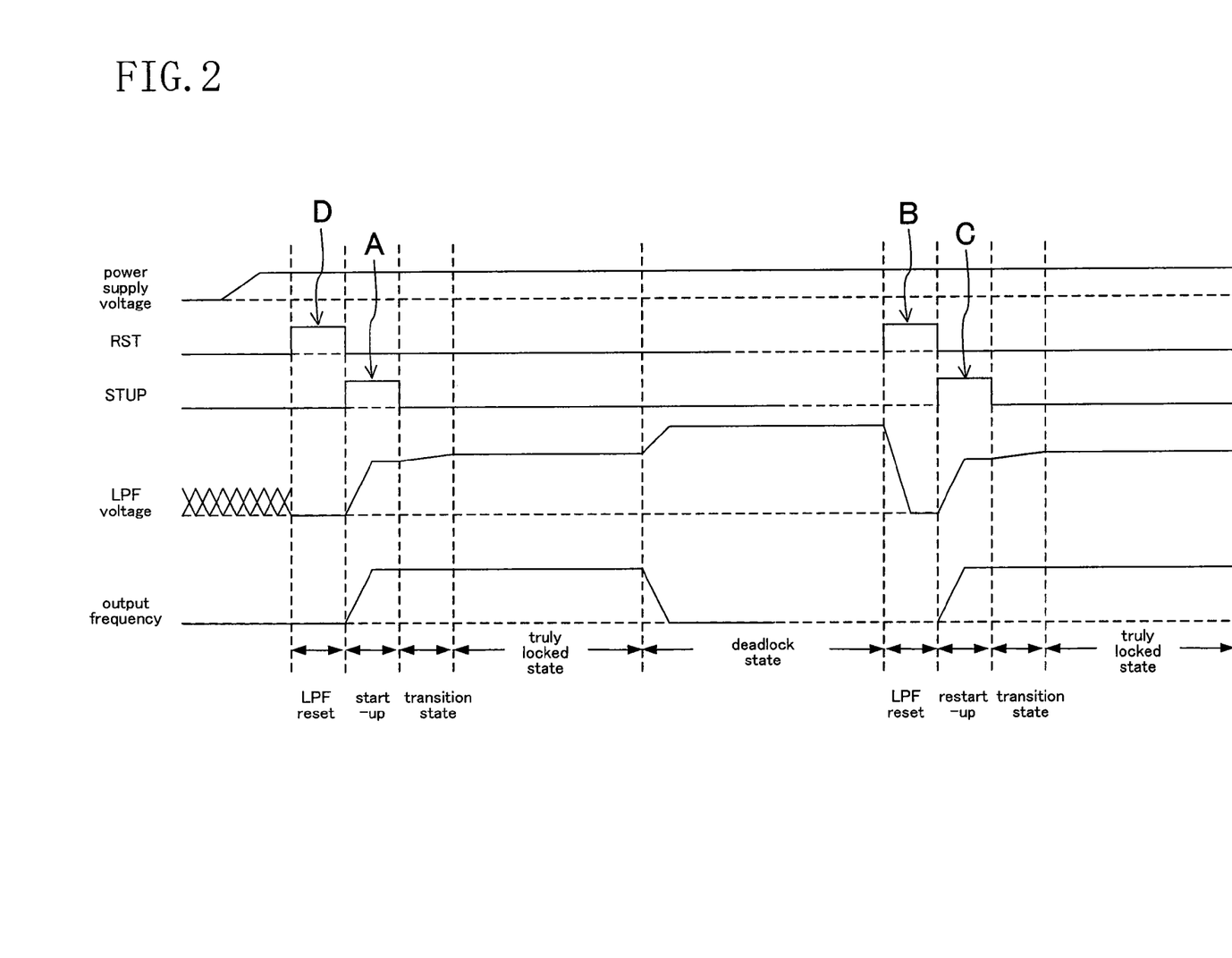
FIG. 2 is a timing chart of the PLL of FIG. 1.

Since the PLL may not operate due to disturbance noise or the like when the loop filter 14 is only reset, the initialization signal STUP is preferably output again after the reset signal RST is output ("C" in FIG. 2). Thereby, it is possible to prevent the output of the PLL from having a high impedance during restart-up, so that the PLL can be restarted up in a stable manner.

Also, since the output voltage of the loop filter 14 is zero during start-up of the PLL, the loop filter 14 does not necessarily need to be reset during start-up. However, the reset signal RST is preferably output earlier than the initialization signal STUP during start-up of the PLL so as to avoid deadlock during start-up ("D" in FIG. 2).

As described above, according to this embodiment, the PLL can be started up and restarted up in a stable manner, particularly without increasing the circuit scale. In addition, even if the PLL falls into the deadlock state, the PLL can be returned from the deadlock state.

Note that, even if the output voltage of the loop filter 14 becomes zero due to disturbance noise or the like, the deadlock detecting circuit 22 detects the abnormality and causes the PLL to restart up. Therefore, even if the output voltage of the loop filter 14 is fixed to zero, there is not a problem with the system.

Also, the deadlock detecting circuit 22 and the control section 24 may be removed, and the initialization signal STUP and the reset signal RST may be externally supplied.

Also, the deadlock detecting circuit 22 and the switch 30 may be particularly removed if only the stabilization of start-up and restart-up of the PLL is required.

Second Embodiment

Figure 3:
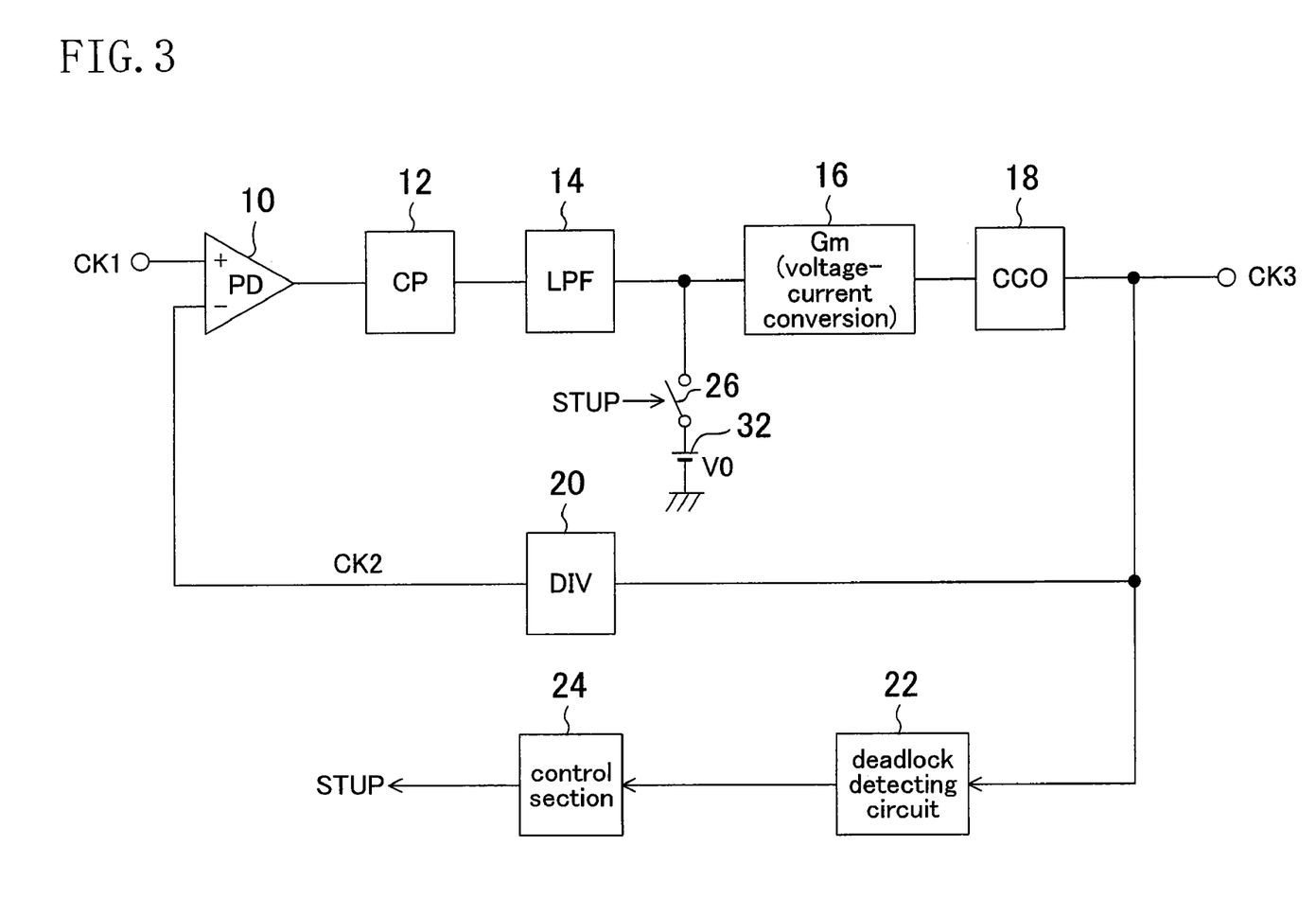
FIG. 3 is a diagram showing a configuration of a PLL according to a second embodiment.

FIG. 3 shows a configuration of a PLL according to a second embodiment. The PLL of this embodiment comprises a switch 26 connected in series to the input terminal of the voltage-current converting circuit 16, and a voltage source 32 having a low output impedance, where the current source 28 and the switch 30 of FIG. 1 are removed.

The switch 26 performs an open/close operation based on the initialization signal STUP. Specifically, when the initialization signal STUP is supplied, the switch 26 is switched ON, so that a voltage V0 of the voltage source 32 is supplied to the voltage-current converting circuit 16. Preferably, the voltage V0 is set in the vicinity of a locked voltage.

In the PLL of this embodiment, the output voltage of the loop filter 14 is set to be the voltage V0 of the voltage source 32 during start-up and during restart-up after detection of deadlock, so that the PLL does not fall into the deadlock state during start-up or restart-up. Also, after the PLL goes to the provisionally locked state, the supply of the voltage V0 is stopped, so that the PLL goes to the truly locked state. Therefore, the PLL can be started up and restarted up in a stable manner without an adverse influence on output jitter and, particularly, without increasing the circuit scale.

Third Embodiment

Figure 4:
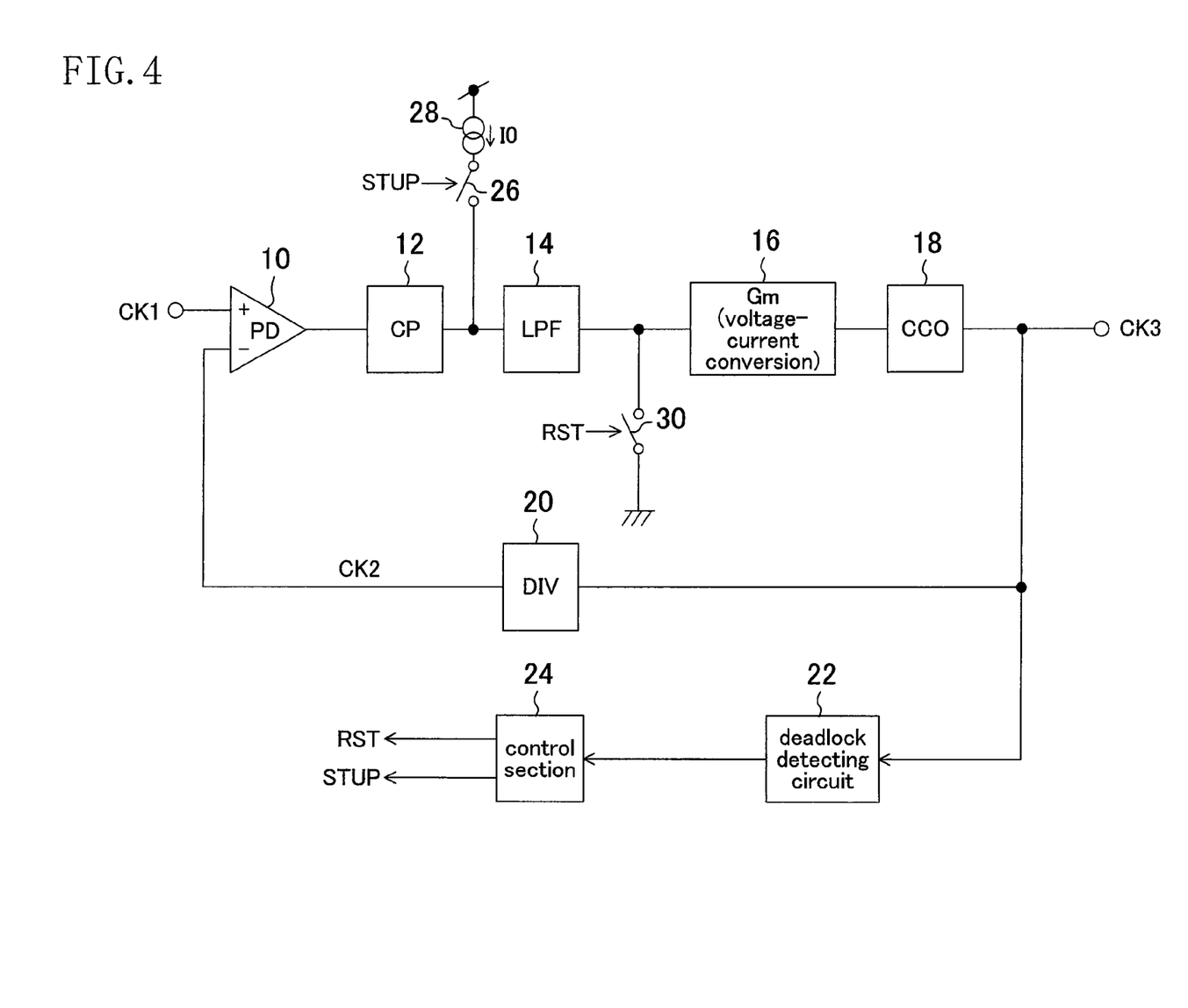
FIG. 4 is a diagram showing a configuration of a PLL according to a third embodiment.

FIG. 4 shows a configuration of a PLL according to a third embodiment. In the PLL of this embodiment, the switch 26 and the current source 28 of FIG. 1 are connected in series to the input terminal of the loop filter 14.

In the PLL of this embodiment, the current I0 is supplied to the loop filter 14 during start-up and restart-up, so that the loop filter 14 is charged. Thereby, it is possible to prevent the output of the PLL from having a high impedance, particularly without increasing the circuit scale, so that the PLL can be started up and restarted up in a stable manner.

Note that, if the loop filter 14 is charged for a long time, the output voltage of the loop filter 14 may excessively increase, so that the PLL may fall into the deadlock state. Therefore, when the frequency of the output clock signal CK3 becomes close to the locked frequency, the output of the initialization signal STUP is preferably stopped.

Fourth Embodiment

Figure 5:
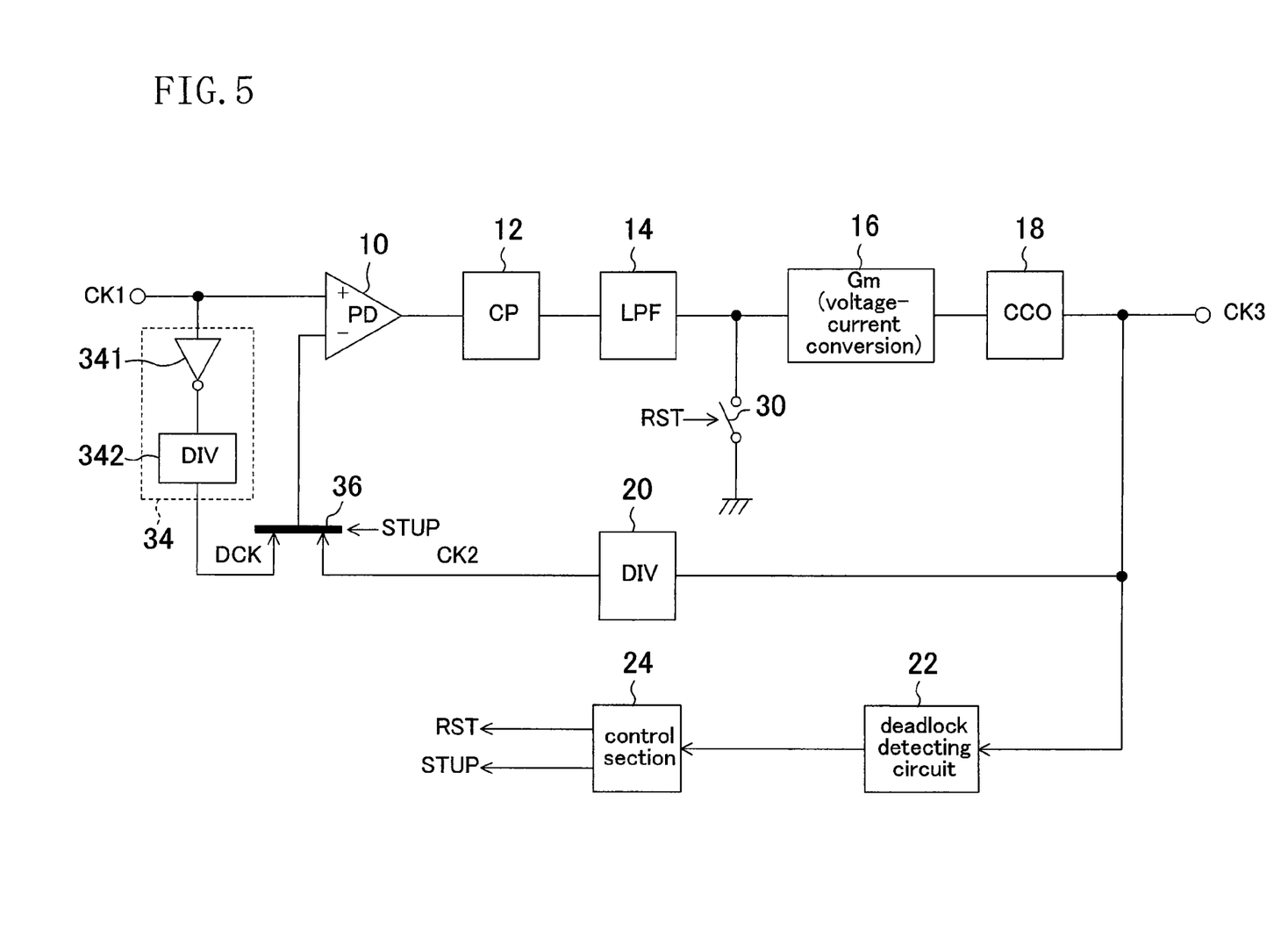
FIG. 5 is a diagram showing a configuration of a PLL according to a fourth embodiment.

FIG. 5 shows a configuration of a PLL according to a fourth embodiment. The PLL of this embodiment comprises a clock generating circuit 34 and a selector 36, where the switch 26 and the current source 28 of FIG. 1 are removed.

The clock generating circuit 34 generates a dummy clock signal DCK having a phase difference with respect to the reference clock signal CK1. Specifically, the clock generating circuit 34 comprises an inverter 341 for inverting the reference clock signal CK1 and a divider 342 for frequency-dividing the output of the inverter 341 to generate the dummy clock signal DCK.

The selector 36 selects a clock signal which is to be compared with the reference clock signal CK1 in the phase detector 10, from the feedback clock signal CK2 and the dummy clock signal DCK, based on the initialization signal STUP. Specifically, the selector 36 selects the dummy clock signal DCK when the initialization signal STUP is, for example, at a Hi level, and the feedback clock signal CK2 when the initialization signal STUP is, for example, at a Lo level.

As described above, according to this embodiment, the dummy clock signal DCK is supplied to the phase detector 10 during start-up and restart-up of the PLL, so that the PLL starts an operation and goes to the provisionally locked state, and thereafter, by switching to a normal input signal, the PLL goes to the truly locked state. Thereby, it is possible to start up and restart up the PLL in a stable manner, particularly without increasing the circuit scale.

Note that the initialization signal STUP is preferably caused to go, for example from the Hi level to the Lo level when the output voltage of the loop filter 14 is charged to a vicinity of the locked voltage, i.e., the frequency of the output clock signal CK3 becomes close to the locked frequency.

Fifth Embodiment

Figure 6:
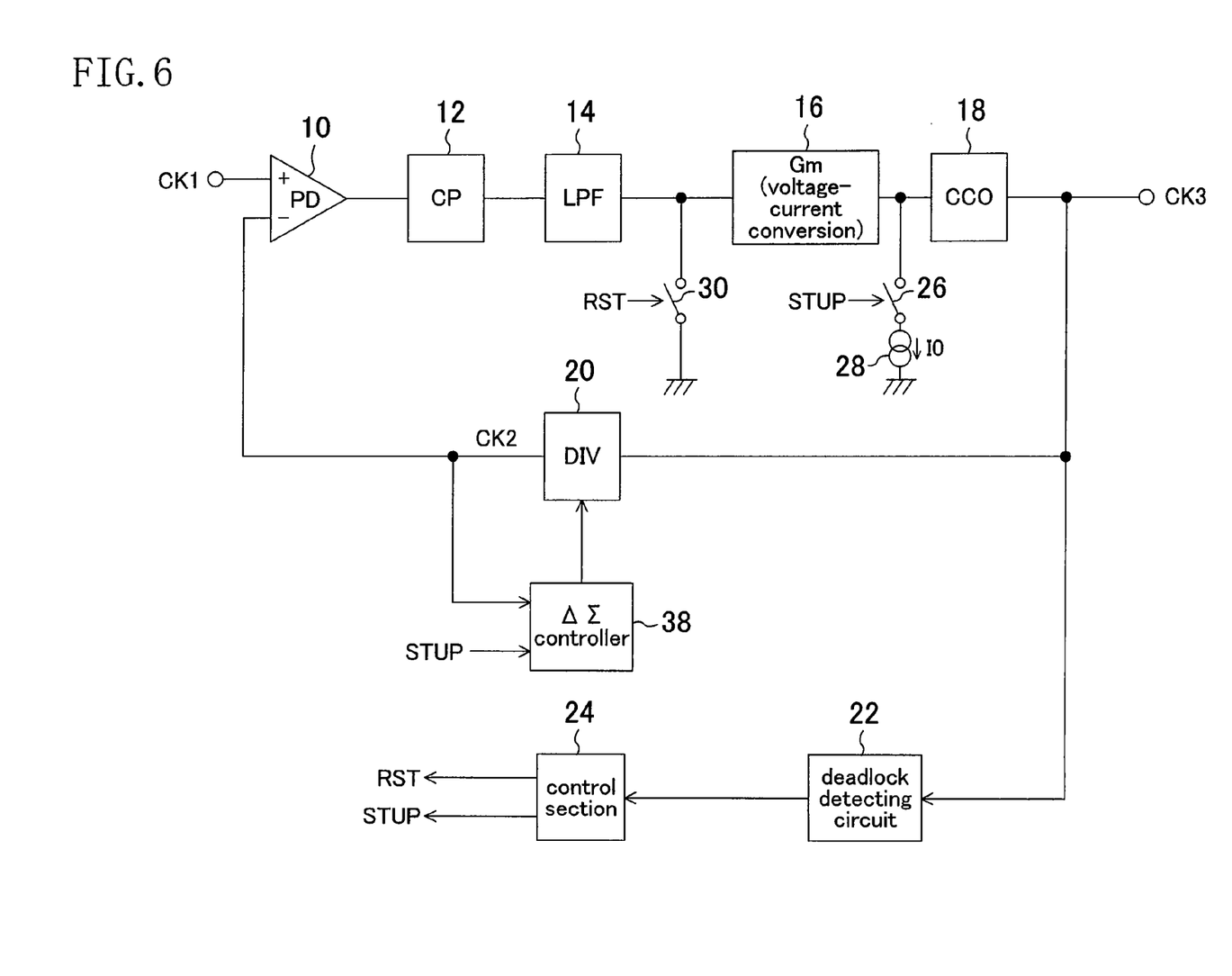
FIG. 6 is a diagram showing a configuration of a PLL according to a fifth embodiment.

FIG. 6 shows a configuration of a PLL according to a fifth embodiment. The PLL of this embodiment is obtained by changing the PLL of FIG. 1 to a ΔΣ PLL.

A ΔΣ controller 38 operates using the feedback clock signal CK2 as a reference. Here, when the output of the PLL is caused to have a high impedance, the output of the divider 20 (fractional-N frequency divider) is also caused to have a high impedance, so that the ΔΣ controller 38 may malfunction and may not be able to be returned. Therefore, during a period of time when the initialization signal STUP is output, the ΔΣ controller 38 is reset so that the ΔΣ controller 38 is prevented from malfunctioning, and an integer ratio close to an original fractional-N frequency division ratio is supplied from the ΔΣ controller 38 to the divider 20.

Figure 7:
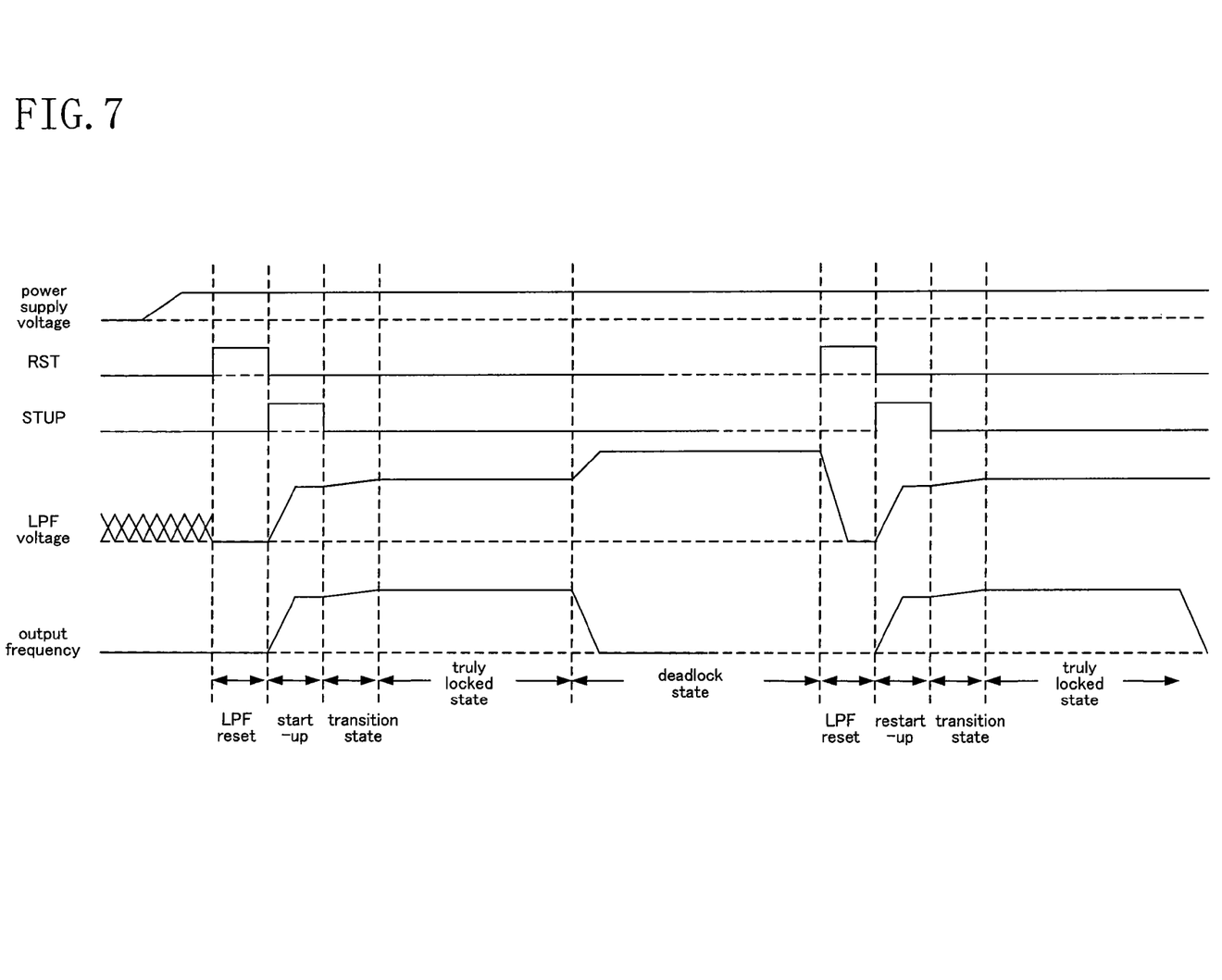
FIG. 7 is a timing chart of the PLL of FIG. 6.

FIG. 7 is a timing chart of the PLL of this embodiment. As compared to the timing chart of FIG. 2, in the timing chart of FIG. 7, the frequency of the output clock signal CK3 fluctuates when the PLL goes from the provisionally locked state to the truly locked state. This is because the fractional part of the frequency-division ratio supplied to the divider 20 differs between during an output period and during a non-output period of the initialization signal STUP. The operation other than this of the PLL is the same as that which has been described with reference to the timing chart of FIG. 2.

Note that the PLLs of FIGS. 3 to 6 and a PLL described below can be configured as ΔΣ PLLs.

Sixth Embodiment

Figure 8:
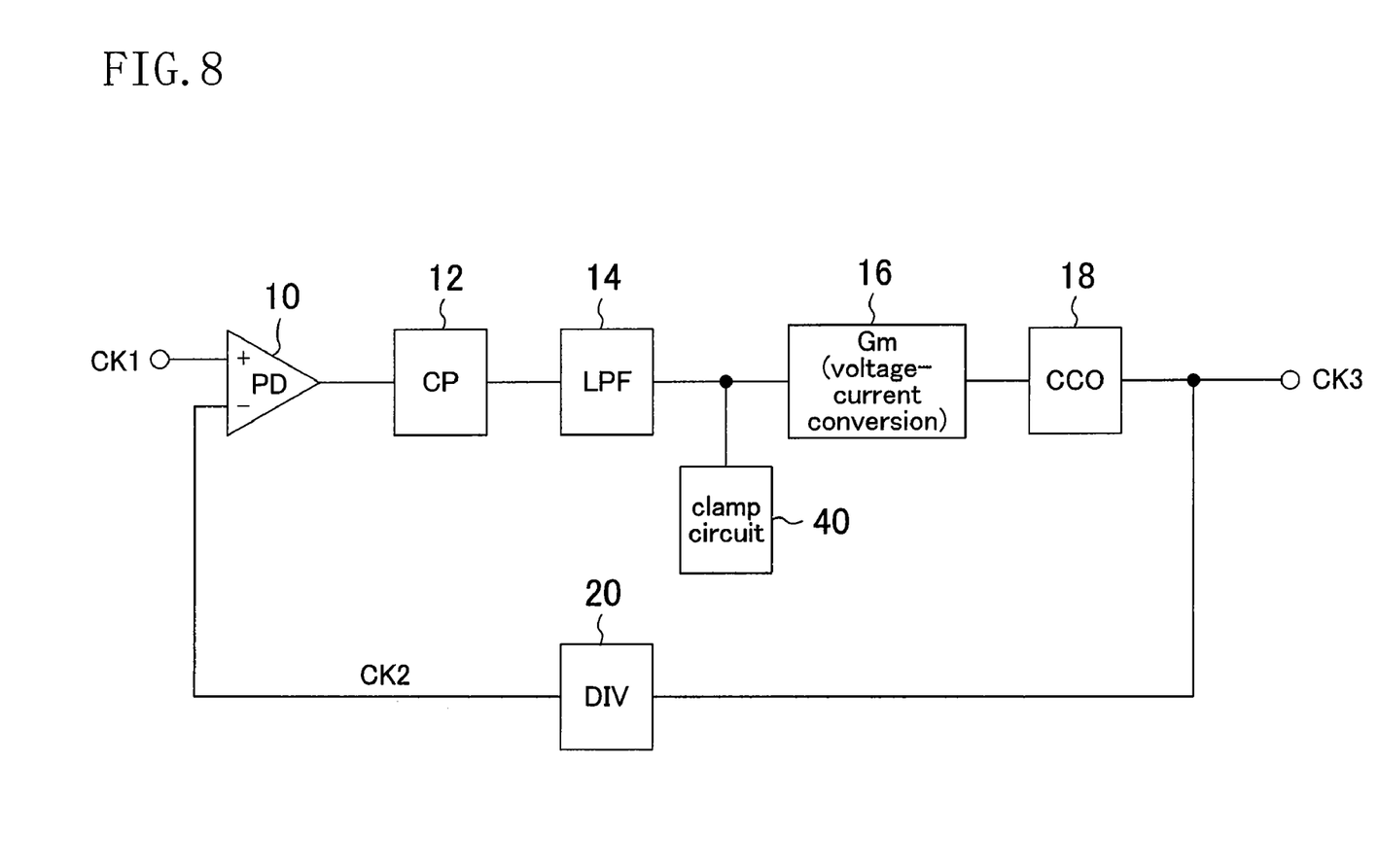
FIG. 8 is a diagram showing a configuration of a PLL according to a sixth embodiment.

FIG. 8 shows a configuration of a PLL according to a sixth embodiment. The PLL of this embodiment comprises a clamp circuit 40 which is connected to the output terminal of the loop filter 14.

Figure 9:
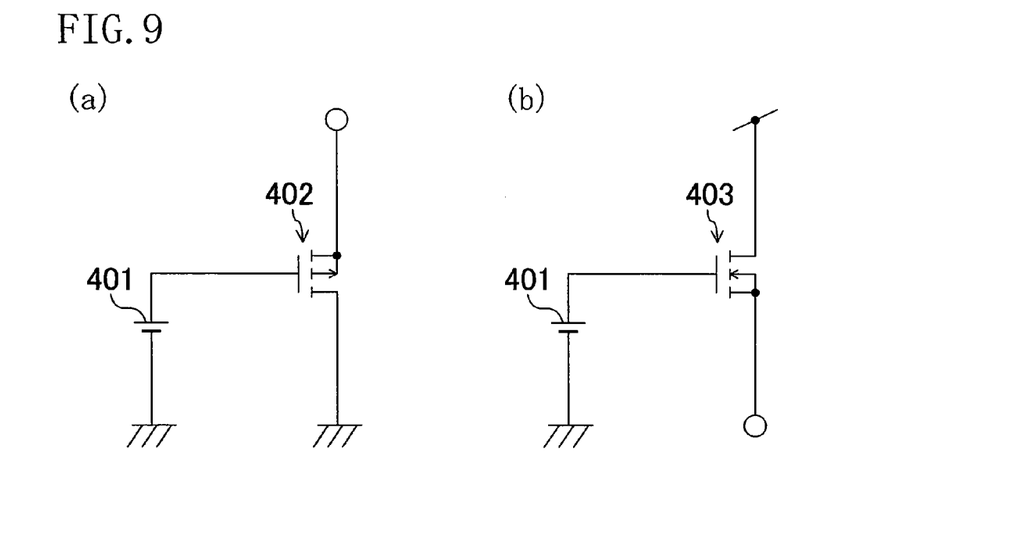
FIG. 9 is a diagram showing a configuration of a clamp circuit.

The clamp circuit 40 imposes upper and lower limits on the output voltage of the loop filter 14. Specifically, the clamp circuit 40 is comprised of an emitter follower circuit, a source follower circuit, or the like. FIG. 9 shows a specific circuit configuration of the clamp circuit 40. An upper clamp circuit which determines the upper limit of the output voltage of the loop filter 14 comprises a voltage source 401 and a PMOS transistor 402 which receives, at its gate, a voltage from the voltage source 401 (see FIG. 9($a$)). On the other hand, a lower clamp circuit which determines the lower limit of the output voltage of the loop filter 14 comprises a voltage source 401 and an NMOS transistor 403 which receives, at its gate, a voltage from the voltage source 401 (see FIG. 9($b$)).

Figure 10:
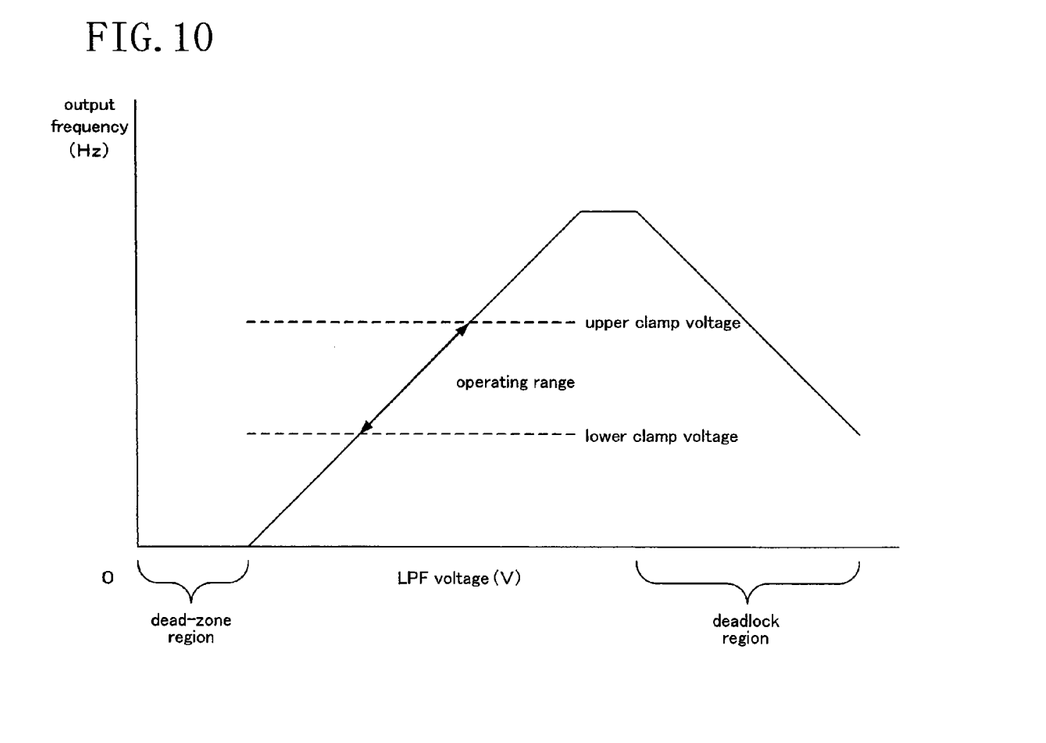
FIG. 10 is a graph showing output voltage-vs-output frequency characteristics of a loop filter in the PLL of FIG. 8.

FIG. 10 shows output voltage-vs-output frequency characteristics of the loop filter 14. By adding the clamp circuit 40 to the PLL, the range of the output voltage of the loop filter 14 is limited. Thereby, the output voltage of the loop filter 14 does not fall into a dead-zone region or a deadlock region. Therefore, during start-up and restart-up of the PLL, the output does not have a high impedance, and deadlock due to disturbance does not occur, so that a stable output clock signal having low jitter can be supplied.

Although it has been assumed in each of the above-described embodiments that the voltage-current converting circuit 16 is comprised of an NMOS transistor or an NPN transistor, the voltage-current converting circuit 16 may be comprised of a PMOS transistor or a PNP transistor. In this case, the reference voltage is a power supply voltage and a direction in which the transistor is switched ON is reversed, so that the effect of the present invention is not impaired.

INDUSTRIAL APPLICABILITY

The PLL of the present invention has a small circuit area and can be started up in a stable manner, and therefore, is useful for a mobile telephone or the like for which a small size is demanded.

The invention claimed is:

1. A PLL circuit comprising a loop filter for smoothing a current which is pushed and pulled in accordance with a phase difference between a reference clock signal and a feedback clock signal, a voltage-current converting circuit for converting an output voltage of the loop filter into a current, and a current-controlled oscillator for generating an output clock signal based on a current signal output from the voltage-current converting circuit, characterized by comprising:

a current source; and an initialization switch which, when receiving an initialization signal, goes to a conductive state, and otherwise, goes to a non-conductive state, the initialization switch being inserted in series to an input terminal of the current-controlled oscillator and the current source;

a reset switch which, when receiving a reset signal, goes to a conductive state, and otherwise, goes to a non-conductive state, the reset switch being provided between an input terminal of the voltage-current converting circuit and a ground node;

a deadlock detecting circuit for detecting that the PLL circuit is in a deadlock state; and a control section, connected to the deadlock detecting circuit, for outputting the reset signal when the deadlock state detected by the deadlock detecting circuit continues for a predetermined time or more, and outputting the initialization signal during start-up of the PLL circuit and following the outputting of the reset signal.

2. The PLL circuit of claim 1, characterized by comprising:
a fractional-N frequency divider for generating the feedback clock signal from the output clock signal; and
a ΔΣ controller for supplying a fractional-N frequency division ratio to the fractional-N frequency divider.

3. The PLL circuit of claim 2, characterized in that
the ΔΣ controller, when receiving the initialization signal, supplies a predetermined integer frequency-division ratio to the fractional-N frequency divider based on the initialization signal.

* * * * *